(12) United States Patent  (10) Patent No.: US 9,099,368 B2
Halliday  (45) Date of Patent: Aug. 4, 2015

(54) ELECTROMAGNETIC SHIELDING FOR CAMERA MODULES

(75) Inventor: William Halliday, Edinburgh (GB)

(73) Assignee: STMICROELECTRONICS (RESEARCH & DEVELOPMENT) LIMITED, Marlow Bucks (GB)

( * ) Notice: Subject to any disclaimer, the term of this patent is extended or adjusted under 35 U.S.C. 154(b) by 1065 days.

(21) Appl. No.: 12/955,461

(22) Filed: Nov. 29, 2010

(65) Prior Publication Data

US 2011/0130177 A1  Jun. 2, 2011

(30) Foreign Application Priority Data

Nov. 30, 2009 (GB) .................................. 0920946.1

(51) Int. Cl.
*H04N 5/225* (2006.01)
*H01L 27/146* (2006.01)

(52) U.S. Cl.
CPC .... *H01L 27/14618* (2013.01); *H01L 27/14623* (2013.01); *H04N 5/2257* (2013.01); *H01L 27/14621* (2013.01); *H01L 27/14625* (2013.01); *H01L 2224/48091* (2013.01); *H01L 2224/48227* (2013.01); *H01L 2924/0002* (2013.01); *Y10T 29/4902* (2015.01)

(58) Field of Classification Search
CPC ....... H04N 5/225; H04N 5/232; H04N 17/00; H04N 5/2251–5/2257
USPC .................................................. 348/373–376
See application file for complete search history.

(56) References Cited

U.S. PATENT DOCUMENTS

| | | | | |
|---|---|---|---|---|
| 4,896,217 | A * | 1/1990 | Miyazawa et al. ............ | 348/340 |
| 7,997,812 | B2 * | 8/2011 | Kim .............................. | 396/529 |
| 2001/0053703 | A1 | 12/2001 | Kobayashi | |
| 2002/0006687 | A1 * | 1/2002 | Lam .............................. | 438/118 |
| 2006/0181633 | A1 * | 8/2006 | Seo .............................. | 348/340 |
| 2006/0270094 | A1 * | 11/2006 | Choi .............................. | 438/64 |
| 2007/0146534 | A1 * | 6/2007 | Kim et al. .................... | 348/340 |
| 2009/0021635 | A1 | 1/2009 | Cheng | |
| 2009/0096051 | A1 | 4/2009 | Sugiyama et al. | |
| 2009/0126984 | A1 * | 5/2009 | Saneto et al. ................ | 174/350 |
| 2009/0130791 | A1 | 5/2009 | Kwon et al. | |
| 2010/0165183 | A1 * | 7/2010 | Tian ............................. | 348/374 |
| 2010/0284081 | A1 * | 11/2010 | Gutierrez et al. ............ | 359/554 |

FOREIGN PATENT DOCUMENTS

| | | |
|---|---|---|
| EP | 0807976 A2 | 11/1997 |
| EP | 1107222 | 6/2001 |
| EP | 1603166 A1 | 12/2005 |
| EP | 1942661 | 7/2008 |
| EP | 1944807 | 7/2008 |
| EP | 2136553 A1 | 12/2009 |
| JP | 2006105877 | 4/2006 |
| JP | 2007022364 | 2/2007 |
| WO | 2005018286 | 2/2005 |
| WO | 2005098956 | 10/2005 |
| WO | 2008023894 A1 | 2/2008 |
| WO | 2008132979 A1 | 11/2008 |
| WO | 2009076789 A1 | 6/2009 |

* cited by examiner

*Primary Examiner* — Roberto Velez
*Assistant Examiner* — Tuan Le
(74) *Attorney, Agent, or Firm* — Allen, Dyer, Doppelt, Milbrath & Gilchrist, P.A.

(57) ABSTRACT

A camera module may include a substrate, and an image sensor mounted on the substrate. The camera module may also include a housing, and an electromagnetic interference (EMI) shield provided around the image sensor and within the module. The camera module may be particularly suited for use in a mobile telephone, for example.

23 Claims, 8 Drawing Sheets

ELECTROMAGNETIC SHIELDING FOR CAMERA MODULES

FIELD OF THE INVENTION

The present disclosure relates to electromagnetic shielding for camera modules.

BACKGROUND OF THE INVENTION

Digital image sensing based upon solid state technology is known. The two most common types of image sensors currently may be charge coupled devices (CCDs) and complementary metal oxide semiconductor (CMOS) image sensors. Digital image sensors may be incorporated within a wide variety of devices throughout the consumer, industrial, defence, and other sectors.

An image sensor is a device that may comprise one or more radiation sensitive elements having an electrical property that changes when radiation is incident upon them, together with circuitry for converting the changed electrical property into a signal. As an example, an image sensor may comprise a photodetector that generates a charge when radiation is incident upon it. The photodetector may be sensitive to electromagnetic radiation in the range of (human) visible wavelengths, or other neighboring wavelength ranges, such as, infra-red or ultra-violet, for example. Circuitry may be provided that collects and carries the charge from the radiation sensitive element for conversion to a value representing the intensity of incident radiation.

Typically, more than one radiation sensitive element may be provided in an array. The term pixel is used as a shorthand for picture element. In the context of a digital image sensor, a pixel may refer to that portion of the image sensor that contributes one value representative of the radiation intensity at that point on the array. These pixel values may be combined to reproduce a scene that is to be imaged by the sensor. A plurality of pixel values may be referred to collectively as image data. Pixels may usually be formed on and/or within a semiconductor substrate. In fact, the radiation sensitive element may comprise only a part of the pixel and only part of the pixel's surface area (the proportion of the pixel area that the radiation sensitive element takes up may be known as the fill factor). Other parts of the pixel may be taken up by metallization, such as, transistor gates and so on. Other image sensor components, such as readout electronics, analog-to-digital conversion circuitry, and so on, may be provided at least partially as part of each pixel, depending on the pixel architecture.

A digital image sensor may be formed on and/or within a semiconductor substrate, for example, silicon. The sensor die may be connected to or form an integral subsection of a printed circuit board (PCB). A camera module may be a packaged assembly that may comprise a substrate, an image sensor, and a housing. The housing may comprise optical components, for example, one or more lenses. Camera modules of this type may be provided in various shapes and sizes for use with different types of devices, for example, mobile telephones, webcams, and optical mice, to name but a few.

Various other elements may be included as part of the module, for example, infra-red filters, lens actuators, and so on. The substrate of the module may also comprise further circuitry for read-out of the image data and for post processing, depending upon the chosen implementation. For example, in system on a chip (SoC) implementations, various image post processing functions may be carried out on a PCB substrate that forms part of the camera module. Alternatively, a co-processor may be provided as a dedicated circuit component for separate connection to and operation with the camera module.

Electronic devices may be sensitive to electromagnetic fields. The effect is known as electromagnetic interference (EMI). Unwanted electromagnetic fields can interfere with the correct operation of the electronic devices. As well as being sensitive to EMI, electronic devices can also generate EMI that can degrade the performance of the devices themselves, or of other electronic components. It may be desirable for electronic devices that they are electromagnetically compatible for use in the specific environment for which they are designed. Electromagnetic compatibility may be referred to as EMC.

In general, unwanted EMI may be dealt with in two ways: either by electrical or circuit level modifications, or by physical shielding. Of course a combination of both types may be used for a particular device as appropriate. Electrical techniques for dealing with EMI emissions from a device may include modifying the timing of clock signals by frequency modulation so that spectral density is reduced. This may not reduce the overall energy of the emitted EMI, but it may reduce unwanted peaks, which would block frequency channels for data communication or other purposes. At the circuit level, the length of path that may act to transmit or receive EMI can be reduced. It may also be possible to introduce lossy components and relatively low impedance paths to a ground to suppress noise.

Physical techniques may predominantly use shielding in the form of conductive layers or ground planes. Shields may act to absorb EMI or to reflect it, depending on the type and quantity of material that is used.

Existing shielding approaches for camera modules may include a metal can, electroplating, or conductive paint. All of these techniques may be applied to the outside of the module.

However, a metal may add significant weight and bulk to the overall assembly. The forming process for manufacturing a metal may have a relatively poor yield, and the design of components within the module, such as, lens actuators, and so on, may have to take into account the specific structure of the metal can in advance, in the design process. The connection to ground of the metal may also present problems, as it may rely on metallized sockets, or, in the case of flexed camera modules, a more complicated grounding chain, which may have poor reliability.

Electroplating is relatively expensive to apply and often requires multiple passes of a plating applicator to achieve satisfactory coating. Coated modules also bond with conductive glue or paste to maintain a conductive path to the shield ground. The electroplated coatings may be easily scratched or damaged during handling, which may result in visual defects and foreign matter causing optical occlusion or electrical shorting.

Conductive paint is relatively cheaper to apply, however, the masking of the paint may present issues, and consistent application may be difficult. Use of conductive paint may also involve an additional curing process, adding time and expense to the manufacturing process.

Trends in the manufacture of electronic devices increasingly consider EMI. For example, in the mobile telephone industry, there is a relatively strong desire to increase battery life, while providing multiple functions on one device. Additionally, there is a desire to reliably receive weaker signals to maintain communications. The weaker signals and sensitive antennas mean that unwanted EMI has a greater effect on the signal quality for voice and data calls. Pressure on pricing also means that, in addition to the desire for robust EMI shielding, the manufacturing process may be as efficient as possible.

SUMMARY OF THE INVENTION

Accordingly, it may be highly desirable to provide improved EMI shielding for camera modules. According to a first aspect of the present disclosure a camera module may comprise a substrate, an image sensor mounted on the substrate, a housing, and an EMI shield provided around the image sensor and within the module.

The EMI shield may comprise a conductive coating on at least part of one surface above the image sensor, and an electrically conductive element on the substrate. The conductive coating may be provided on the surface of a component which is immediately adjacent the image sensor in a vertical direction.

The conductive coating may be selectively applied so that the part of the component to whose surface the conductive coating is applied, that is for bonding to the substrate, may be kept free from the conductive coating. The conductive coating may be selectively applied so that part or parts of the component to whose surface the conductive coating is applied that may include electrical contacts may be kept free from conductive coating.

The camera module may comprise an infra-red (IR) filter holder, and the conductive coating may be provided on the underside of the infra-red (IR) filter holder. The camera module may comprise a lens holder, and the conductive coating may be provided on the underside of the lens holder.

A conductive path may be formed between the conductive coating and the electrically conductive element. The conductive path may be formed from electrically conductive glue.

The camera module may further comprise a conductive shield ring on the top surface of the substrate. The conductive coating may comprise an electroplated coating. The camera module may further comprise a second conductive coating with a matte finish and/or of a dark or black color.

According to a second aspect of the disclosure, a mobile telephone may comprise a camera module comprising a substrate, an image sensor mounted on the substrate, a housing, and an EMI shield provided around the image sensor and within the module. According to a third aspect of the disclosure, an infra-red (IR) filter holder for incorporation in a camera module may comprise a conductive coating on at least part of one surface. According to a fourth aspect of the disclosure, a lens holder for incorporation in a camera module may comprise a conductive coating on at least part of one surface.

BRIEF DESCRIPTION OF THE DRAWINGS

The present invention will now be described by way of example only with reference to the accompanying drawings in which.

DETAILED DESCRIPTION OF THE PREFERRED EMBODIMENTS

Figure 1:
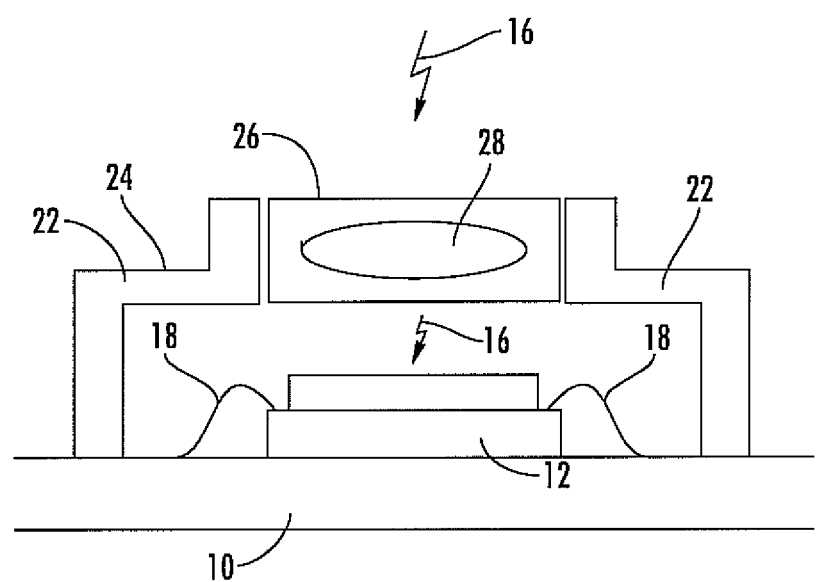
FIG. 1 is a schematic diagram of a camera module according to the prior art.
Figure 2:
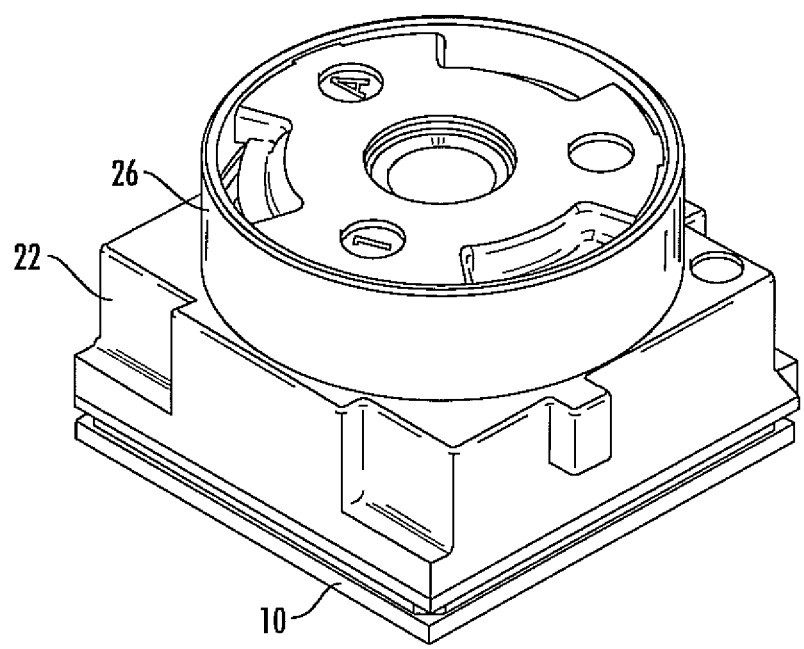
FIG. 2 is a perspective view of the camera module of FIG. 1.

FIG. 1 shows a typical camera module. Selected components are shown for ease of illustration in the present disclosure, and it is to be understood that other components may be incorporated into the structure. An imaging die 12 is assembled on a substrate 10. The substrate 10 could be a PCB, ceramic, or other material. The imaging die 12 comprises a radiation sensitive portion, which collects incident radiation 16. For an image sensor the radiation sensitive portion will usually be photosensitive, and the incident radiation 16 will usually be light including light in the (human) visible wavelength ranges, as well as, perhaps, infrared and ultraviolet. Bond wires 18 are provided for forming electrical connections with the substrate 10. Other electrical connections are possible, such as solder bumps, for example. A number of electrical components are formed in the body of the imaging die 12 and/or the substrate 10. These components may control the image sensing and readout operations and switch at high speed generating EMI in the process. They may also sensitive to incident EMI. The module includes a mount 22, a lens housing 26, and lens 28 for focussing incident radiation 16 onto the radiation sensitive portion of the image sensor. FIG. 2 shows a perspective view of the apparatus FIG. 1, showing the substrate 10, mount 22, and lens housing 26.

According to this disclosure, an EMI shield is positioned around an image sensor in a camera module. By "around" an image sensor, it is meant that a conductive path is provided at or above an upper surface of an image sensor, and that a conductive path is provided at or above a lower surface of the image sensor. Each of the conductive paths may be formed by conductive elements. These conductive elements may not entirely cover the surfaces of the image sensor. The provision of an EMI shield around an image sensor within a camera module is different from prior art camera modules where EMI shields are applied to the external surfaces of the camera modules themselves.

In an embodiment, the EMI shield may be formed by providing a conductive coating to at least part of one surface of a component of the module which is on one side of the image sensor in a vertical axis, and providing an electrically conductive element adjacent the image sensor on the other side to the coated component, and which is connected to ground, or to another suitable reference voltage. The component that is provided with the conductive coating may be the component that is immediately adjacent the image sensor in a vertical axis.

The electrically conductive element may be formed during a manufacturing process by choosing a solder mask to leave a portion of an underlying metallization layer exposed. The exposed portion may, for example, be a ring, square, or other shape, formed to match the shape of the component to which a conductive coating is applied.

The electrically conductive element may be connected to a ground, for example, by connecting it to a ground plane of either a circuit's digital components or its analog components. The choice of the digital or analog ground plane may depend on the specific application for EMC purposes or otherwise.

The conductive coating may be achieved cost effectively as the coating is on one side of the component. The conductive coating may be an electroplated coating, for example. When electroplating is used, a mask fixture may readily be manufactured to ensure only surfaces requiring plating get plated. Other forms of a conductive coating, such as, conductive paint may be used.

During assembly, an electrical connection may be between the conductive coating that is applied to component above the image sensor and the electrically conductive element that is provided on the substrate. In one embodiment, the conductive coating may be applied to the entire underside surface of the component above the image sensor, and a conductive glue is used to join the component to the substrate.

This arrangement may, however, be impractical in some circumstances, especially with smaller dies and more densely packed components, as overspill of the conductive glue may increase the risk of short circuits. To address this problem, it may be possible to form the electrical connection at one or more selected portions or points of the component. The remaining connections may then be formed with standard, non-conductive glue.

The image sensor is therefore sandwiched with a conductive shield both above and below the sensor. A shielded enclosure is therefore formed, within which the sensor can operate with increased radiated emissions and susceptibility performance with respect to the electromagnetic environment.

Some camera modules may include a dedicated IR filter holder. These camera modules may be typically variable focus camera modules, that is, modules that may comprise autofocus mechanisms and those that enable manual focusing (some will enable both, that is, some camera modules have focus adjustment mechanisms that can be driven by either or automatic or manual methods). There are various different mechanisms for adjusting the focus of the lens or other optical components, including, for example, a barrel and screw thread with corresponding motors and actuators, or liquid lenses that change shape to vary the focus.

Other types of camera modules may not comprise a dedicated IR filter holder. The only specialized holder provided may be a lens holder. When an IR filter is included, it may be a simple plate that is between the lens holder and the image sensor. These camera modules are typically fixed focus camera modules, which are used for relatively cheaper, less sophisticated systems. The lens or other optical components may be held at a fixed position with respect to the image sensor.

Figure 3:
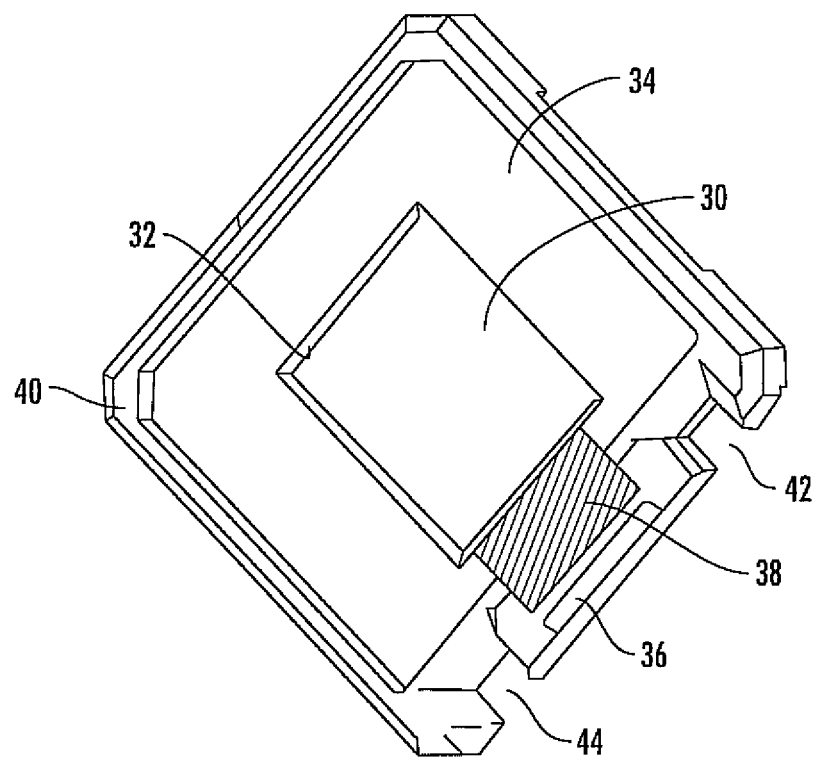
FIG. 3 is a perspective view of an infra-red (IR) filter holder with a conductive coating applied according a first embodiment.

A first embodiment of the disclosure is shown in FIG. 3, which illustrates a plating applied to an IR filter holder as used in a variable focus camera module. Typically, this component has an infra-red filter glass attached over the aperture and is fitted over the sensor to protect the sensor from foreign matter (FM) and from other physical damage, for example, from the bonding of electrical connections. FIG. 3 views the IR filter holder from below, showing the aperture 30 inside which the image sensor sits with its radiation sensitive pixel array facing the aperture 30.

Trials indicate that surfaces with a conductive coating do not give as high an adhesive strength as surfaces with no coating applied. Also, the properties of conductive glues are different from standard, non-conductive glues. Conductive glues may often exhibit lesser shear strength and have less desirable other mechanical properties than non-conductive glues.

After the IR filter holder component is fabricated, a conductive coating may be applied to selected portions of the component, rather than being applied to the entire surface of the component. The aperture comprises inner walls 32 which, in this example, are angled surfaces. A conductive coating may be selectively applied to these inner walls.

The surface of the component also comprises a recessed portion 34. A conductive coating may be selectively applied to this recessed portion 34.

The component comprises a bond pad 36 for electrical connection with the other items of the module structure. A coating may be applied between the inner walls 32 of the aperture 30 over the bond pad 36, as illustrated by region 38 in FIG. 3. This region 38 of coating may be applied over various structural elements, such as walls or trenches.

The component includes a raised portion 40 that is used to bond the IR filter holder to the substrate of the camera module. In one embodiment, a conductive coating is applied to this raised portion 40, and conductive glue is used to connect the component to a substrate. However, in an alternative embodiment, to reduce the risk of shorting the operating circuits of the PCB or of the image sensor, it may be possible to keep this raised portion 40 free from the conductive coating, and use standard, non-conductive glue (which as mentioned above, has increased adhesive properties over conductive glue, and therefore enhances the strength of the module). In that case however, the region 38 includes a portion that is part of the raised portion 40, to form the electrical connection to shield the image sensor. Note that this represents a small part of the raised portion, and substantially all the raised portion may be kept free from conductive coating in this embodiment.

It will be appreciated that keeping any of the surface that bonds the component to the substrate free from conductive coating will improve the strength of the bond that is formed, as compared with the case where the entire surface is provided with a conductive coating. In a preferred embodiment, substantially all of the surface that bonds the component to the substrate is kept free from conductive coating, as illustrated in FIG. 3. However, it will be appreciated that, in other embodiments, smaller portions of the surface may be kept free from conductive coating, and still provide improvements in strength and reliability of the constructed module.

A conductive coating may also be kept away from areas where electrical contact may occur (such as, motor terminals, for example). FIG. 3 shows two recesses 42, 44 through which voice coil motor contacts pass.

During assembly a continuous bead of glue may be deposited on the substrate (carrying the image sensor) that encircles the image sensor and surface-mounted device (SMD) components within the shield. To reduce electrical shorts, this bead may be non-conductive. An additional bead of glue may be deposited on the ground bond pad on the substrate. This is conductive to provide the electrical path between the IR filter holder conductive coating and the electrical ground path.

The IR filter holder is then placed on top of the substrate (which carries the image sensor), with the conductive coated side facing downwards to form the shielded enclosure around the image sensor. It may be possible to apply the conductive gluing step at a different point in the process if desired necessitating minor modification to the IR filter holder.

In one embodiment, the method of providing a conductive coating comprises the step of electroplating the component. This technique lends itself to masking to achieve the selectivity of the application of the conductive coating.

Figure 4:
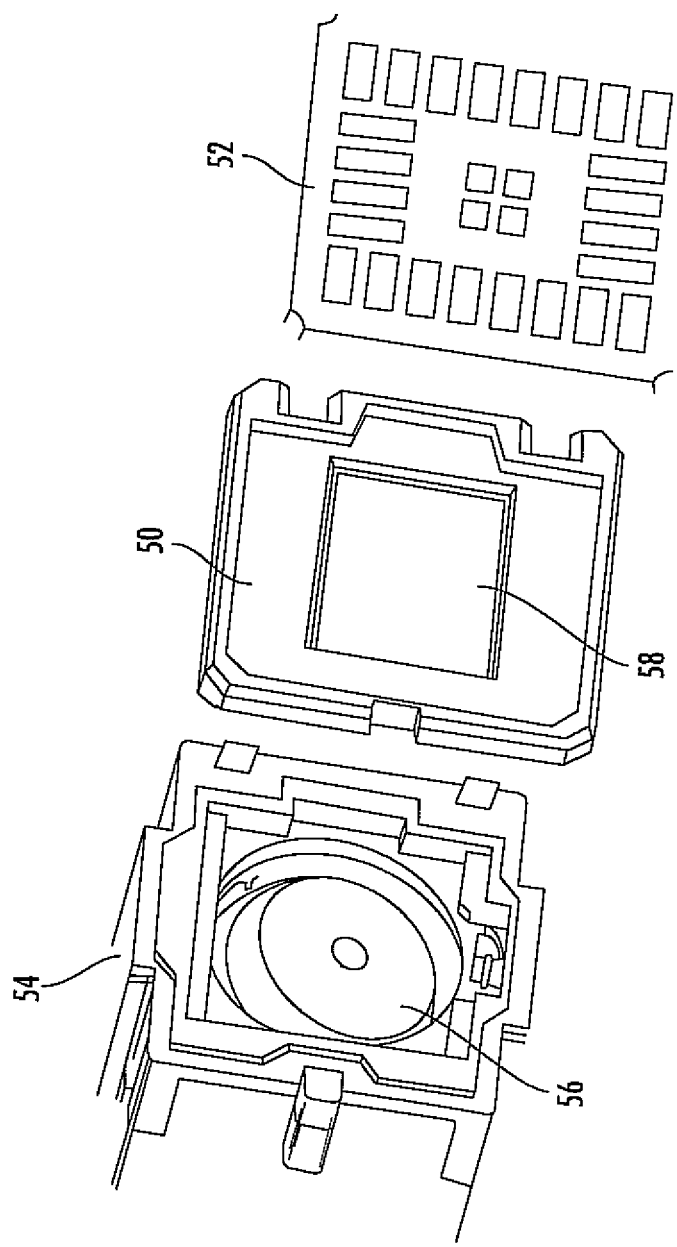
FIG. 4 is an exploded view of the IR filter holder of FIG. 3 in a camera module.
Figure 5:
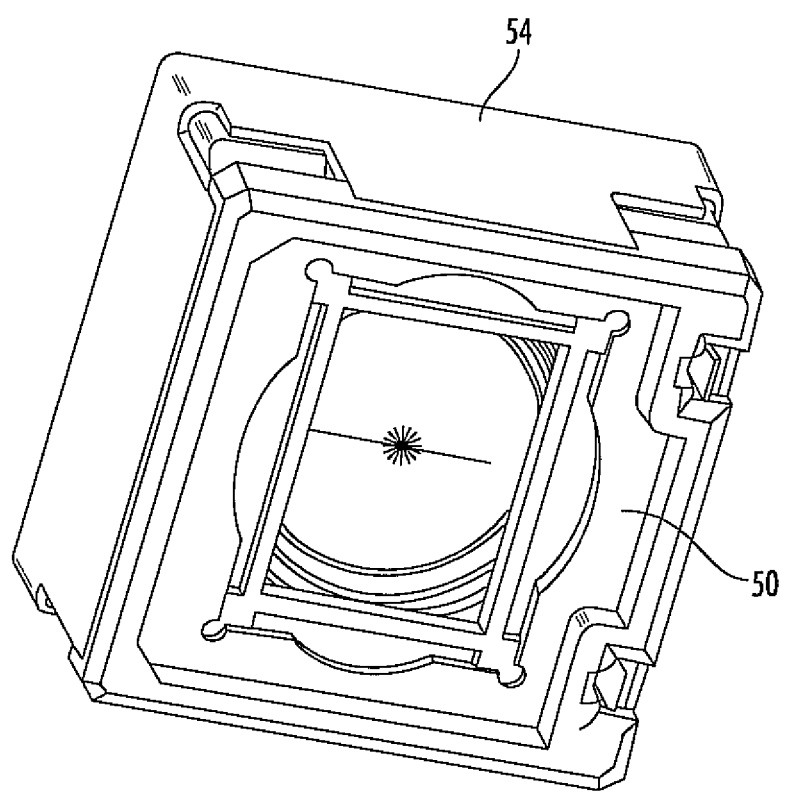
FIG. 5 is a perspective view of the IR filter holder of FIG. 3 in a camera module housing.

FIG. 4 is an exploded view and shows the incorporation of the IR filter holder of FIG. 3 within a camera module. The IR filter holder 50 is between a substrate 52 and a housing 54. The housing 54 comprises, in this example, a lens 56, and other components for adjusting the focus of the lens. The substrate 52 includes an image sensor (FIG. 4 illustrates the underside of the substrate 52. The sensor is on the other side). The IR filter holder 50 also includes an IR filter 58 including glass or other suitable material exhibiting appropriate transmission characteristics. Additionally, the IR-glass itself (of this and of all other embodiments) may be coated with an optically-transmissive, electrically-conductive coating, such as ITO (Indium Tin Oxide), which if bonded to the IR-holder using a conductive compound, may further enhance the faraday cage effect at the expense of some loss of light transmission. FIG. 5 shows the IR filter holder 50 of FIG. 4 fixed in place in the housing 54 of FIG. 4.

Figure 6:
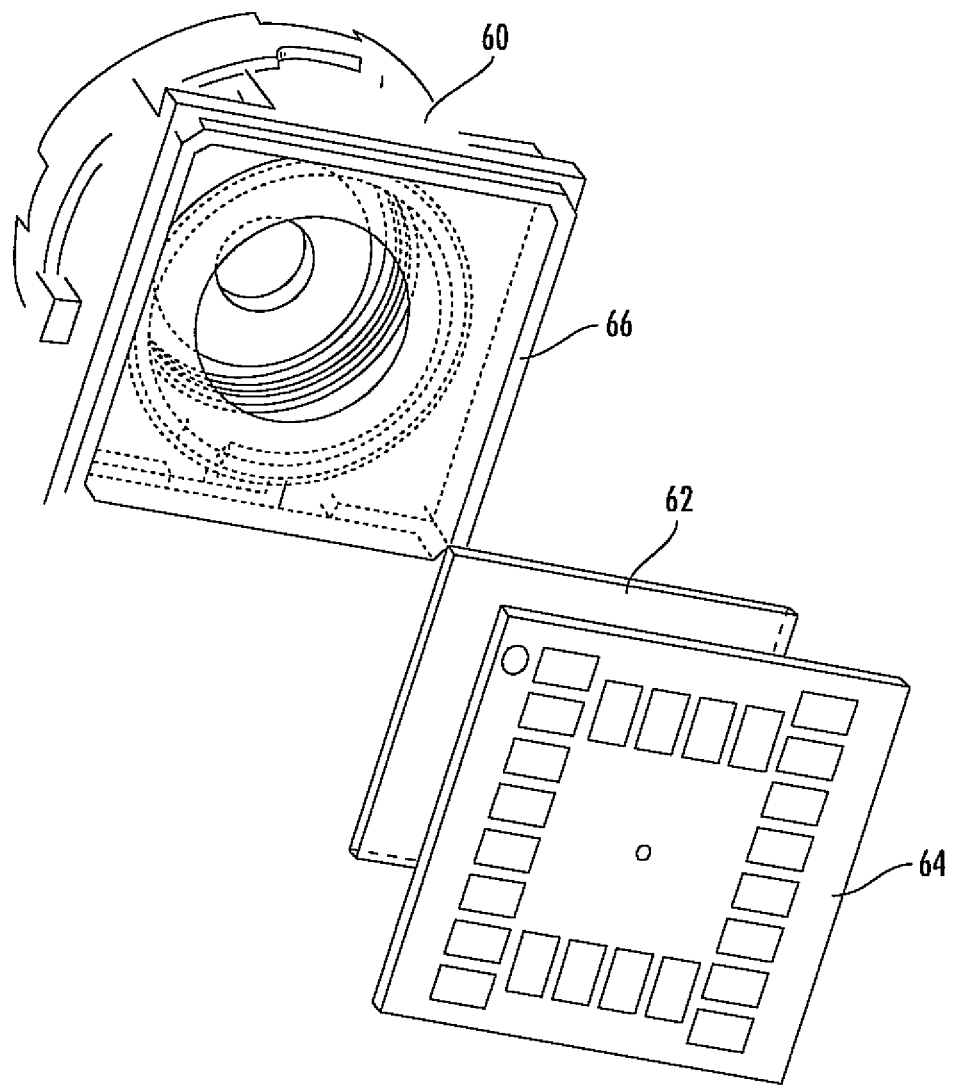
FIG. 6 is an exploded perspective view of an alternative embodiment wherein a conductive coating is applied to a lens holder of a fixed focus camera module.

A further embodiment of the disclosure is shown in FIG. 6, which illustrates a plating applied to a lens holder 60, as used in a fixed focus camera module. The lens holder 60 forms a lower portion of the housing of the camera module. An IR filter 62 comprising glass or other suitable material exhibiting appropriate transmission characteristics is placed within the lens holder 60. When fixed in position, it is held above the substrate 64. The substrate 64 includes an image sensor (FIG. 6 illustrates the underside of the substrate 52. The sensor is on the other side).

The lens holder 60 has a surface 66 that contacts the substrate 64. This surface is kept relatively free from conductive coating.

It will be appreciated that the embodiments shown are specific examples of camera modules, and that the principles discussed herein are applicable across a much wider range of devices. In all camera modules, there will be an opening above the sensor through which light must pass to permit the basic functioning of the camera module. However, a large amount of EMI will not generally be passed through the opening because the image array itself is passive and metal layers are not passed across the array.

Furthermore, the component of the module which is immediately adjacent the image sensor will generally be a relatively very small distance above the sensor, meaning that the effective gap for EMI to emerge or enter is actually quite small. In general, there may be limited impact in terms of stray light or ghosting due to additional reflections off the plated surfaces. However, any degradation that does exist may be compensated for by applying a further conductive coating with a matte finish and/or in a black color. This can, for example, be a conductive paint. This might be desirable for high-end applications where very high imaging accuracy is desired, or in applications where a relatively large amount of EMI is to be expected from external sources.

It should also be noted that the aperture of the IR filter holder or of the lens holder is generally much smaller than the lens opening at the front of camera modules. Therefore, applying shielding at the level of the IR filter holder or the lens holder may result in a smaller diameter (or other equivalent characteristic dimension) unshielded area through which electromagnetic radiation may pass when compared with shielding that is applied at the top surface of the housing of a camera module.

Figure 7:
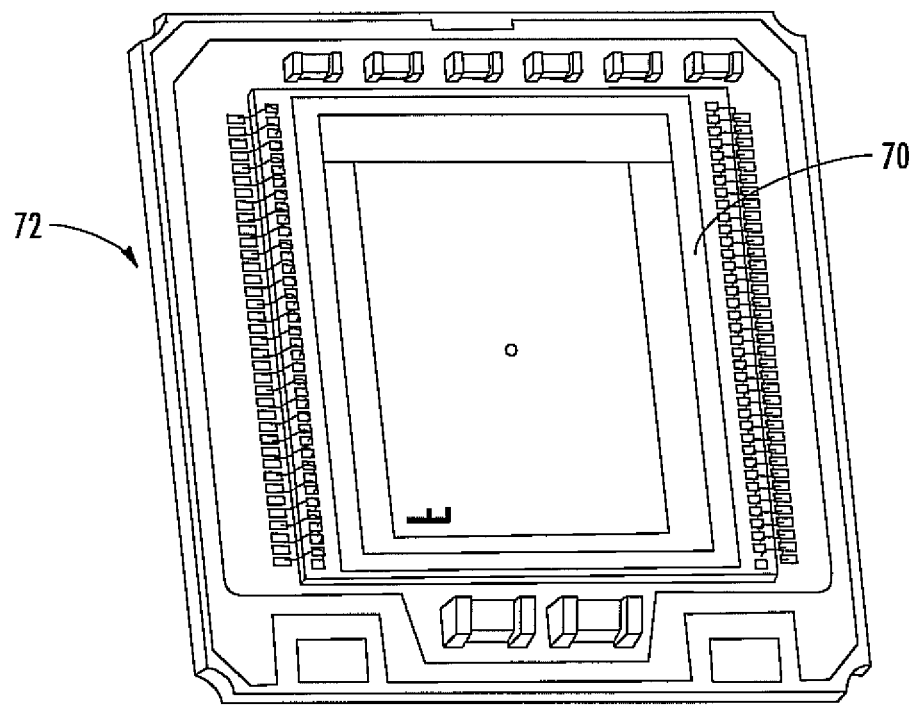
FIG. 7 is a perspective view of a shield ring formed on a substrate of a camera module.

According to further embodiments, further techniques may be employed to reduce any remaining gaps through which electromagnetic emissions can escape or enter the shielded area. FIG. 7 illustrates one such technique, wherein a conductive shield ring 70 is formed on the top surface of a substrate 72 to which an IR filter holder or a lens holder is to be bonded (with conductive or non-conductive glue). The shield ring 70 stands proud of the substrate 72 surface and so acts to reduce EMC issues via the gaps in the sides of the assembly between the IR filter holder or lens holder and the substrate. Care should be taken in the formation of the conductive shield ring 70 to reduce shorting between the shield ring 70 and SMD components or conductively coated surfaces and SMD components.

In still further embodiments, the profile of the IR filter holder or the lens holder can be further improved to reduce the gap around the image sensor. Under this concept, the IR filter holder or the lens holder may be bonded onto the top of the image sensor surface around the image array.

The approaches of this disclosure provide many advantages. The active components of the camera module are enclosed within a much smaller shielded volume as compared with existing designs. An improved faraday cage is achieved surrounding the image sensor, reducing emissions and susceptibility of electromagnetic fields.

Existing shielding may be applied to the entire camera module, and may take no account of which part of the module has most EMC impact. In contrast, the present disclosure provides for increased shielding performance by careful and considered application of conductive coatings, reduction of EMI gaps, while also reducing cost, weight, visual defects, and FM related issues.

When electroplating is used, the number of process steps may be reduced because the electroplating may be applied to one surface of the component that is closest to the image sensor. The design of the present disclosure also means that EMI apertures (especially the optical window, required for image sensors) are reduced in size and placed much closer to the substrate, so reducing the gaps for EMI to escape from the module or to enter the enclosed space.

Also, the direct connection to ground via the module substrate may reduce the number of components and interfaces appearing in the conductive path. Existing approaches rely on socket spring contacts, etc., and the return path to the reference ground may be relatively complex.

This disclosure brings benefits to camera modules with lens actuators and those without lens actuators. In modules without lens actuators, such as fixed focus camera modules or extended depth of field (DOF) camera modules, the improved faraday cage around the image sensor may all but eliminate all EMI. Lens actuators, in principle take away from this ideal case as the operation of the actuators may involve some EMI. However, the disclosure still provides marked advantages in all cases. For example, some actuators, such as Voice Coil Motors, use only a DC signal to be passed out with the shielded space for focus control. Some actuators by their nature may emit or may be susceptible to EMI in their own right. The actuator may be outside the shielded space as taught by this disclosure, however much of the high frequency emissions that are of concern are not related to the actuator technology, and are far more dependent upon the sensor technology.

Figure 8:
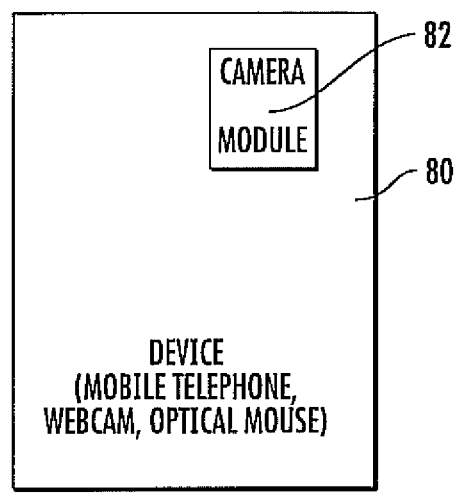
FIG. 8 is a schematic block diagram of a device incorporating a camera module.

Camera modules according to the present disclosure may be incorporated into a wide variety of devices. FIG. 8 shows a device 80 incorporating a camera module 82 according to the disclosure. The device may, for example, be a mobile telephone, webcam, or optical mouse, for example. The manner of incorporation of the camera module into each of these devices may be known to those skilled in the relevant arts and so detailed teaching is not part of this document. Various improvements and modifications can be made to the above without departing from the scope of the invention.

That which is claimed:

1. A camera module comprising:
   a housing;
   a substrate carried by said housing;
   a component carried by said substrate and having opposing first and second surfaces and an opening therein, the opening defining an inner wall, said component also having a raised perimeter and at least one recess extending inwardly from the raised perimeter;
   an image sensor carried by the first surface of said component adjacent the opening; and
   an electromagnetic interference (EMI) shield within said housing and comprising an electrically conductive coating over at least a portion of the inner wall and at least a portion of one of the first and second surfaces, the one of the first and second surfaces also having a portion thereof free of said electrically conductive coating, the at least one recess being free of said electrically conductive coating, and the raised perimeter having at least a portion thereof free of said electrically conductive coating.

2. The camera module of claim 1, wherein said EMI shield further comprises an electrical conductor carried by said substrate and adjacent another of first and second surfaces.

3. The camera module of claim 2, wherein said electrical conductor comprises an exposed portion of a metallization layer.

4. The camera module of claim 3, wherein the exposed portion has a shape based upon a shape of said component.

5. The camera module of claim 2, wherein said component further comprises at least one electrical contact carried by one of the first and second surfaces, and wherein a portion of the one of the first and second surfaces carrying said at least one electrical contact is free of said electrically conductive coating.

6. The camera module of claim 2, further comprising a conductive material pathway between said electrically conductive coating and said electrical conductor.

7. The camera module of claim 6, wherein said conductive material pathway comprises an electrically conductive adhesive pathway.

8. The camera module of claim 2, further comprising a further conductive coating with at least one of a matte finish and a black color adjacent at least one of the first and second surfaces.

9. The camera module of claim 1, further comprising a conductive shield ring carried by said substrate.

10. A mobile telephone comprising:
    a camera module comprising
       a housing,
       a substrate carried by said housing,
       a component carried by said substrate and having opposing first and second surfaces and an opening therein, the opening defining an inner wall, said component also having a raised perimeter and at least one recess extending inwardly from the raised perimeter,
       an image sensor carried by the first surface of said component adjacent the opening, and
       an electromagnetic interference (EMI) shield within said housing and comprising an electrically conductive coating over at least a portion of the inner wall and at least a portion of one of the first and second surfaces, the one of the first and second surfaces also having a portion thereof free of said electrically conductive coating, the at least one recess being free of said electrically conductive coating, and the raised perimeter having at least a portion thereof free of said electrically conductive coating.

11. The mobile telephone of claim 10, wherein said EMI shield further comprises an electrical conductor carried by said substrate and adjacent another of first and second surfaces.

12. A camera module comprising:
    a housing;
    a substrate carried by said housing;
    an infra-red (IR) filter carried by said substrate and having opposing first and second surfaces and an opening therein, the opening defining an inner wall, said IR filter also having a raised perimeter and at least one recess extending inwardly from the raised perimeter;
    an image sensor carried by the first surface of said IR filter adjacent the opening; and
    an electromagnetic interference (EMI) shield within said housing and comprising an electrically conductive coating over at least a portion of the inner wall and at least a portion of one of the first and second surfaces, the one of the first and second surfaces also having a portion thereof free of said electrically conductive coating, the at least one recess being free of said electrically conductive coating, and the raised perimeter having at least a portion thereof free of said electrically conductive coating.

13. The camera module according to claim 12, further comprising an electrical conductor carried by said substrate.

14. The camera module according to claim 12, further comprising a conductive shield ring carried by said substrate.

15. A camera module comprising:
    a housing;
    a substrate carried by said housing;
    a lens holder carried by said substrate and having opposing first and second surfaces and an opening therein, the opening defining an inner wall, said lens holder also having a raised perimeter and at least one recess extending inwardly from the raised perimeter;
    an image sensor carried by the first surface of said lens holder adjacent the opening; and
    an electromagnetic interference (EMI) shield within said housing and comprising an electrically conductive coating over at least a portion of the inner wall and at least a portion of one of the first and second surfaces, the one of the first and second surfaces also having a portion thereof free of said electrically conductive coating, the at least one recess being free of said electrically conductive coating, and the raised perimeter having at least a portion thereof free of said electrically conductive coating.

16. The camera module according to claim 15, further comprising an electrical conductor carried by said substrate.

17. The camera module of claim 16, further comprising a conductive material pathway between said electrically conductive coating and said electrical conductor.

18. A method of making a camera module comprising:
    providing a component to be carried by a substrate within a housing, the component having opposing first and second surfaces and an opening therein, the opening defining an inner wall, the component also having a raised perimeter and at least one recess extending inwardly from the raised perimeter;
    providing an image sensor to be carried by the first surface of the component adjacent the opening substrate, the image sensor having opposing first and second surfaces; and
    positioning an electromagnetic interference (EMI) shield within the housing, the EMI shield comprising an electrically conductive coating over at least a portion of one of the first and second surfaces and at least a portion of the inner wall adjacent at least one of the first and second surfaces, the one of the first and second surfaces also having a portion thereof free of the electrically conductive coating, the at least one recess being free of the electrically conductive coating, and the raised perimeter having at least a portion thereof free of the electrically conductive coating.

19. The method of claim 18, wherein positioning the EMI shield further comprises positioning an electrical conductor carried by the substrate and adjacent another of first and second surfaces.

20. The method of claim 19, wherein providing the component comprises providing an infra-red (IR) filter.

21. The method of claim 19, wherein providing the component comprises providing a lens holder.

22. The method of claim 19, further comprising forming a conductive material pathway between the electrically conductive coating and the electrical conductor.

23. The method of claim 19, wherein the electrically conductive coating is electroplated over at least a portion of one of the first and second surfaces and the inner wall.

* * * * *